United States Patent [19]

Sprague

[11] Patent Number: 4,633,445

[45] Date of Patent: Dec. 30, 1986

[54] ERASEABLE SOLID STATE OPTICAL MEMORIES

[75] Inventor: Robert A. Sprague, Saratoga, Calif.

[73] Assignee: Xerox Corporation, Stamford, Conn.

[21] Appl. No.: 681,776

[22] Filed: Dec. 14, 1984

[51] Int. Cl.[4] ............................................. G11C 13/04
[52] U.S. Cl. .................................... 365/234; 365/235; 365/215; 365/113
[58] Field of Search ............... 365/234, 235, 215, 126, 365/127, 117, 112, 106, 113

[56] References Cited

U.S. PATENT DOCUMENTS

| | | | |
|---|---|---|---|
| 3,555,987 | 1/1971 | Browning | 95/53 |
| 3,593,318 | 7/1971 | Browning | 365/117 |
| 3,631,409 | 12/1971 | Buchan | 365/234 |
| 3,676,864 | 7/1972 | Maure et al. | 365/127 |
| 3,765,749 | 10/1973 | LaMacchia | 365/106 |
| 3,899,778 | 8/1975 | Roberts | 365/235 |
| 4,434,477 | 2/1984 | Sander et al. | 365/127 |
| 4,551,819 | 11/1985 | Michl et al. | 365/120 |

OTHER PUBLICATIONS

Opto-Logic Corporation, Product Brochure, "Slide Programmed Optical Processor Kit," Apr. 17, 1974.
Quadri Corporation, Preliminary Product Brochure, "Model 401–22 Optical Read Only Memory".
Jackson, A. S., Compen, (Pre-Presentation Paper) "A New Approach to Utilization of Opto-Electronic Technology," Feb. 1974.
C. L. Cohen, "Optical-Disk Alloy Turns Pink or Silver," Electronic Week, Dec. 17, 1984 pp. 29–30.

Primary Examiner—Terrell W. Fears

[57] ABSTRACT

An eraseable solid state optical memory has an array of selectively energizeable photoemitters which are imaged by suitable imaging means onto a data mask to optically address data stored thereon. To that end, the data mask is an eraseable optical recording medium, such as a tellurium suboxide or other chalcogenide material. A data writer is provided for programming, erasing and re-programming the data mask in situ while self-aligning the imaging means with the programmed data mask. The data mask may be erased and/or re-programmed in whole or part, thereby extending the utility of these memories to the storage of data that is subject to change.

6 Claims, 5 Drawing Figures

ERASEABLE SOLID STATE OPTICAL MEMORIES

FIELD OF THE INVENTION

This invention relates to re-programmable (i.e., eraseable) solid state optical memories and, more particularly, to data writers for optically self-aligning such memories while programming their data masks in situ.

BACKGROUND OF THE INVENTION

A copending and commonly assigned U.S. patent application of Robert A. Sprague, which was filed Dec. 4, 1984 under Ser. No. 678,199 on a "Distributed Data Storage Architecture for Block Oriented Solid State Optical Memories" discloses a block oriented solid state optical memory in which the bits of each of the optically addressable data blocks are stored in spatially distributed memory sectors. Another copending and commonly assigned U.S. patent application of Robert A. Sprague and John C. Urbach, which was filed Dec. 4, 1984 under Ser. No. 678,145 on "High Density Block Oriented Solid State Optical Memories", discloses an improved imaging system for optically addressing the data stored in such a memory, thereby increasing its maximum permissible bit storage density. These memories are "block oriented" because the data stored therein is selectively addressable in multi-bit data blocks, and they have "distributed data storage architectures" because the bits of each of the data blocks are stored in spatially distributed memory sectors. Moreover, a copending and commonly assigned U.S. patent application of Robert A. Sprague, which was filed Dec. 14, 1984 under Ser. No. 681,775 on a "Programmable Solid State Optical Memories and Data Writer Therefor" discloses a programmable "read only" memory of the foregoing type, together with a data writer for programming and optically aligning such a memory.

Others have proposed a so-called "concentrated page storage architecture" for block oriented solid state optical memories. According to these proposals, each page or block of data is concentrated within a single, optically addressable memory "sector", so that it can be retrieved on demand by selectively illuminating or "addressing" just that one sector. See, for example, U.S. Pat. No. 3,676,864, which issued July 1, 1972 on an "Optical Memory Apparatus"; U.S. Pat. No. 3,765,749, which issued Oct. 16, 1973 on an "Optical Memory Storage and Retrieval System"; and U.S. Pat. No. 3,899,778, which issued Aug. 12, 1975 on "Means Employing a Multiple Lens Array for Reading From a High Density Optical Memory Storage." However, a distributed data storage architecture is more tolerant of the localized optical defects which are likely to be introduced into solid state optical memories during their fabrication and/or use. It therefore is the preferred architecture, especially for memories having high bit storage densities, such as miniaturized memories and larger, high capacity memories.

Coined descriptors are employed to provide convenient names for the above-described storage architectures. Consequently, it may be helpful to note that the phrases "block of data" and "page of data" are used herein more or less interchangeably. Some of the prior art refers to the storage of optically addressable "pages," so it has been characterized as suggesting a concentrated page storage architecture. Similar terminology could be used to describe the general organization of the data stored in a memory having a distributed data storage architecture, but the preferred terminology provides a more generic description which literally applies to all cases, including one wherein each optically addressable data block comprises a plurality of electrically addressable data segments. As will be appreciated, these data segments might be interpreted as being separate "pages of data" as that phrase is normally used in the data processing field, so alternative terminology has been adopted to avoid confusion.

Block oriented solid state optical memories conventionally comprise a data mask, an array of selectively energizeable photoemitters for optically addressing data stored on the data mask, and an array of photosensors for reading out the optically addressed data. Those that have a distributed data storage architecture additionally include suitable imaging means, such as a shadow mask or a lens array, for imaging the photoemitter array in parallel onto spatially displaced sections of the data mask. Moreover, such a memory is constructed so that the photoemitter array images are optically aligned with respective ones of the photosensors and have sufficient resolution to separately resolve the individual photoemitters. Accordingly, the memory is optically partitioned to define a plurality of spatially distributed memory sectors, each of which is optically subdivided to have a plurality of selectively illuminable memory cells.

To store data in a solid state optical memory having a distributed data storage architecture, multi-bit data blocks are mapped onto its data mask, so that the bits of each data block occupy the memory cells (one bit/cell) which are illuminable or "optically addressable" by a respective one of the photoemitters (one cell/sector). As noted in the aforementioned Sprague application Ser. No. 681,775 filed 12-14-84, the data mask advantageously is an optical recording medium, so that it may be programmed in situ by scanning an intensity modulated write beam across the imaging means at the field angle of successive ones of the photoemitters. That self-aligns the imaging means with the data recorded on the data mask, thereby ensuring that the data can be optically addressed on demand.

SUMMARY OF THE INVENTION

In accordance with the present invention, there is an eraseable solid state optical memory of the type wherein an array of selectively energizeable photoemitters is imaged by suitable imaging means onto the data mask to optically address data stored thereon. To that end, the data mask is an eraseable optical recording medium, such as a tellurium suboxide or other chalcogenide material. A data writer is provided for programming, erasing and re-programming the data mask in situ while self-aligning the imaging means with the programmed data mask. The data mask may be erased and/or re-programmed in whole or part, thereby extending the utility of these memories to the storage of data that is subject to change.

To carry out the programming/alignment process, the data writer scans an intensity modulated write/erase beam across the aperture or apertures of the imaging means at a predetermined scan rate and in accordance with a predetermined scanning pattern. The beam is focused sufficiently to resolve a single aperture, and the data writer varies the field angle of the beam with respect to each of the apertures as a function of time. As a result, there are certain unique time slots during which the write/erase beam falls on any given aperture, and its field angle is adjusted so that it falls on the given aperture from the field angle of a different one of the photoemitters during each of those time slots.

For recording data on the data mask (i.e., to "program" or "re-program it), the intensity of the write/erase beam is modulated in accordance with the values ("1" or "0") of successive bits of a data bit stream. The modulation is time synchronized with the scanning process, so that each bit is recorded while the write/erase beam is passing through a predetermined aperture at the field angle of a predetermined photoemitter Accordingly, the recorded bits and the image or images of the photoemitter array are relatively precisely spatially aligned on the data mask, even if the images are distorted.

The data bit stream, in turn, is organized so that the scanning pattern maps the bits onto the data mask in accordance with a preselected mapping pattern. Typically, the write/erase beam has a relatively fast fall time during the data recording process so that the recording medium is rapidly quenched while bits of a predetermined, say, high (1) logic level are being written thereon, whereby those bits are represented by localized transformations in the optical transmission characteristics of the recording medium.

Essentially the same process is used to erase pre-recorded data in whole or part, except that the intensity of the write/erase beam is modulated in accordance erase pulses which have a relatively slow fall time, whereby the recording medium is slowly quenched to substantially restore it to its non-programmed state.

BRIEF DESCRIPTION OF THE DRAWINGS

Still other features and advantages of this invention will become apparent when the following detailed description is read in conjunction with the attached drawings, in which.

DETAILED DESCRIPTION OF THE ILLUSTRATED EMBODIMENT

While the invention is described in some detail hereinbelow with specific reference to a single illustrated embodiment, it is to be understood that there is no intent to limit it to that embodiment. On the contrary, the aim is to cover all modifications, alternatives and equivalents falling within the spirit and scope of the invention as defined by the appended claims.

Figure 1:
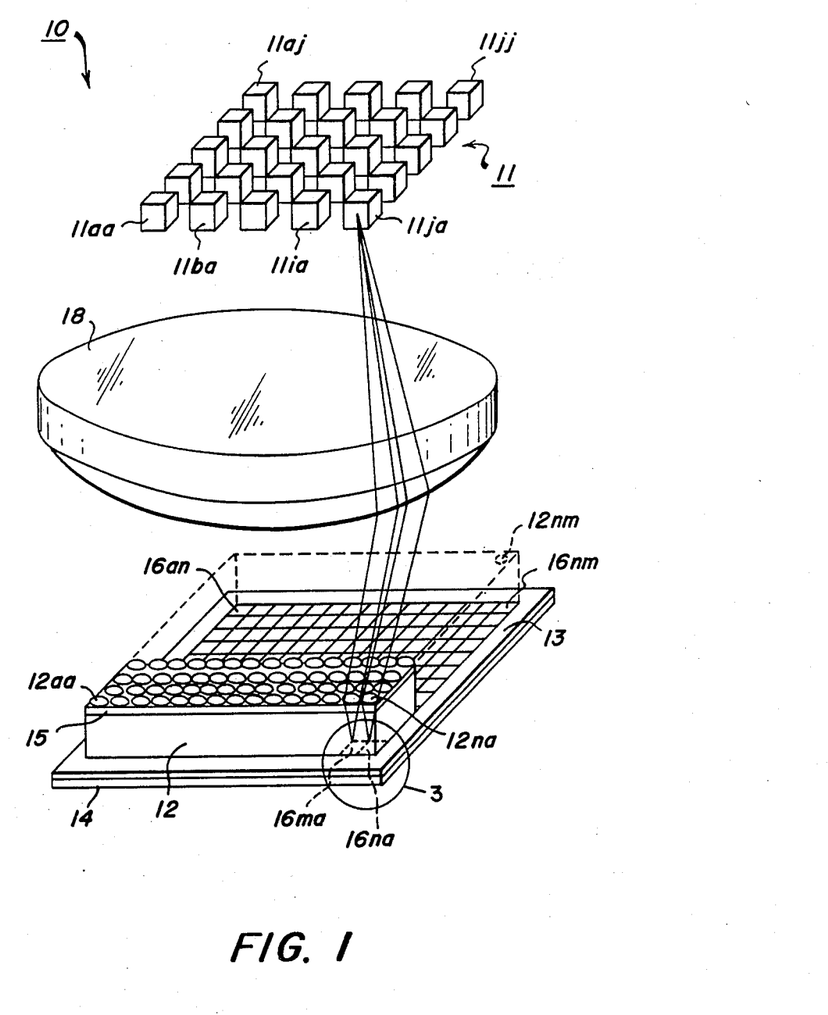
FIG. 1 is a simplified isometric view of a block oriented solid state optical memory having a distributed data storage architecture.
Figure 2:
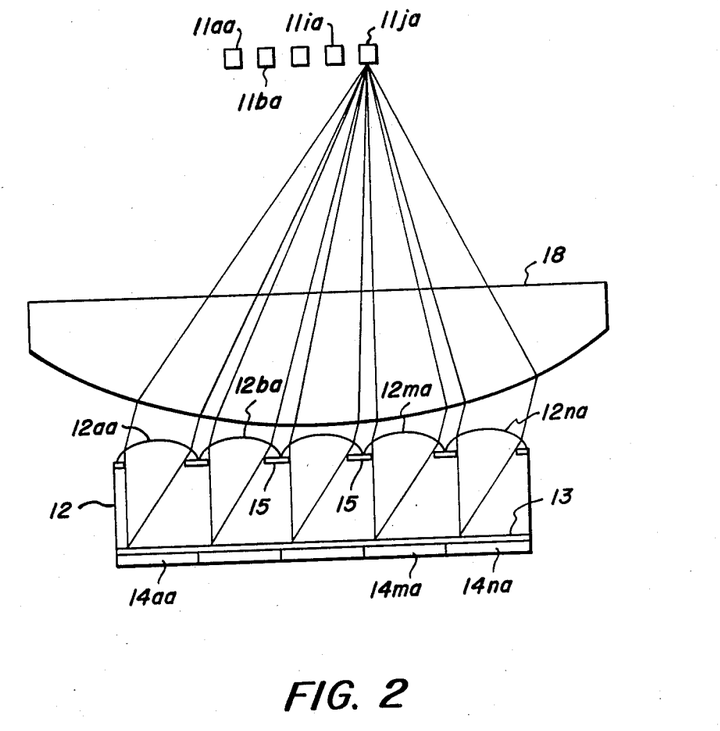
FIG. 2 is a schematic sectional view of the memory shown in FIG. 1.

Turning now to the drawings, and at this point especially to FIGS. 1 and 2, there is a solid state optical memory 10 comprising a photoemitter array 11, a lens array 12, a data mask 13 and a photodetector array 14, which are maintained in substantially parallel relationship with respect to one another. As illustrated, the photoemitter array 11 is a two dimensional, planar array of selectively energizeable light emitting diodes (LEDs) 11$aa$–11$jj$, and the photodetector array 14 is a two dimensional, planar array of photodiodes or other photosensitive elements 14$aa$–14$nn$. For example, the photodetector array 14 may be a more or less conventional silicon RAM device, stripped of its usual light shield and fabricated to have expanded drain capacities.

Two dimensional photoemitter and photodetector arrays are preferred because they increase the storage capacity of the memory 10, but linear arrays could be employed if desired. Planar arrays are favored because of their commercial availability and their ease of application. To simplify this disclosure, a straightforward convention has been employed, whereby features of the memory 10 that depend on the size of photoemitter array 11 are identified by reference numerals having the same alphabetical suffixes as the photoemitters 11$aa$–11$jj$, while those that depend on the the size of the photodetector array 14 are identified by reference numerals having the same alphabetical suffixes as the photosensors 14$aa$–14$nn$. Since two dimensional photoemitter and photodetector arrays are shown, the first and second letters of each suffix represent column and row locations, respectively.

Figure 3:
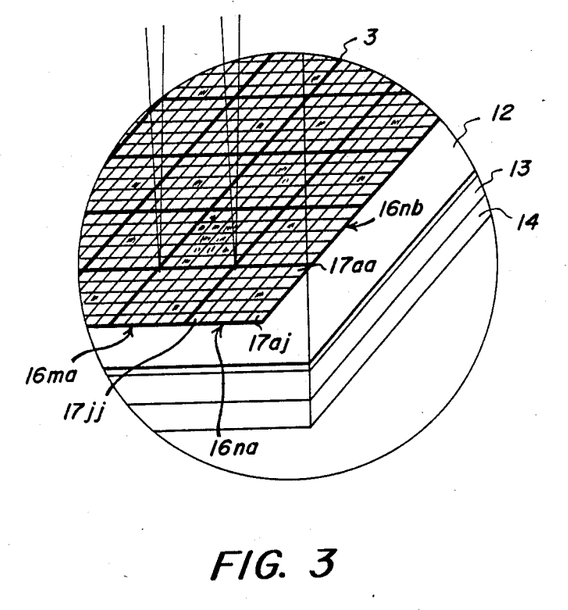
FIG. 3 is a fragmentary magnified view of the enclosed area 3 in FIG. 1 to illustrate a respresentative portion of the memory in additional detail.

To create a distributed data storage architecture for the memory 10, the lens array 12 has a plurality of laterally displaced lenslets 12$aa$–12$nn$ on its first surface for focusing images of the photoemitter array 11 in parallel onto laterally distinct sections of the data mask 13. A shadow mask (not shown) could be substituted for the lens array 12, but that would significantly reduce the maximum permissible bit storage density of the memory 10 In any event, the images which are focused or projected onto the data mask 13 have sufficient resolution to separately resolve the individual photoemitters 11$aa$–11$jj$ and are optically aligned with the photosensors 14$aa$–14$nn$, respectively. Thus, as most clearly shown in FIG. 3, the memory 10 is optically partitioned to have a plurality of spatially displaced "memory sectors" 16$aa$–16$nn$, each of which is optically subdivided into a plurality of selectively addressable "memory cells" 17$aa$–17$jj$. Therefore, in operation, the photoemitters 11$aa$–11$jj$ are selectively and individually energized (i.e., no more than one of them is energized at any given time) to optically address a predetermined memory cell 17$aa$, 17$ba$, . . . or 17$jj$ within each of the memory sectors 16$aa$–16$nn$. For example, when the photoemitter 11$aa$ is energized, the memory cells 17$aa$ of all of the memory sectors 16$aa$–16$nn$ are optically addressed, thereby causing the photosensors 14$aa$–14$nn$ to accumulate charges corresponding to the contents of those memory cells.

As will be seen, the data mask 13 is located between the lens array 12 and the photosensor array 14, so its optical transmission profile determines the bit contents of all of the memory cells 17$aa$–17$jj$. The profile of the data mask 13 is defined, in turn, by the multi-bit data blocks which are written thereon. While the programming of the data mask 13 is described in more detail hereinbelow, it should be noted at this point that data blocks are mapped onto it in accordance with a mapping pattern which distributes the bits of each data block to the memory cells (one bit/cell) which are optically addressable by a predetermined photoemitter 11$aa$, 11$ba$, . . . or 11$jj$ (one cell/sector). Furthermore, in accordance with the present invention, the lenslets 12$aa$–12$nn$ are self-aligned with the data blocks stored on the data mask 13, whereby the photosensors 14aa–14nn accumulate charges corresponding to the bits of a selected data block whenever one of the photoemitters 11aa–11jj is energized. Preferably, the data mask 13 is bonded to the last surface of the lens array 12 to preclude any relative motion between the lenslets 12aa–12nn and the data mask 13, thereby preventing the alignment from being upset by extrinsic factors, such as changes in temperature and/or humidity. For minimizing the lateral scattering of light incident on the data mask 13, it additionally is overcoated on or otherwise maintained in intimate contact with the photosensitive surface of the photodetector array 14. Advantageously, the lens array 12 has a generally uniform optical thickness, so the apertures of the lenslets 12aa–12nn are more or less optically equidistant from the data mask 13.

A substantial amount of data may be stored in a relatively compact memory of the above-described type. For example, a commercially available 16×16 LED array 11 and a more or less conventional 64K silicon photodetector array 14 may be employed to construct a miniaturized version of the memory 10 measuring roughly 1"×1"×1". This miniaturized unit is capable of storing up to 256 separate optically addressable data blocks, each containing up to 64,000 or so individual bits, thereby providing a total bit capacity of approximately 16.8Mbits. The data storage density of that device is so high that essentially diffraction limited performance is required of the lenslets 12aa–12nn.

All of the bits of an optically addressed data block can be retrieved by reading out all of the photosensors 14aa–14nn after an appropriate charge accumulation period or "data access time," which usually is on the order of 10–100 microseconds or longer. As a general rule, however, the data blocks are organized to permit shorter related groups of bits to be selectively stripped therefrom, such as by selectively addressing the photosensors 14aa–14nn. For example, suitable electronics (not shown) may be provided for electrically addressing the detector elements 14aa–14nn on a row-by-row or a column-by-column basis, thereby permitting data segments having a length of 256 bits to be read out selectively from, say, a 256×256 photodetector array 14. Furthermore, each of those data segments might also be organized so that even shorter, word length groups of bits, such as standard 32 bit or 64 bit long data words, can be selectively recovered therefrom, but such "post read-out" processing of the data is beyond the scope of this disclosure.

Due to the distributed data storage architecture of the memory 10, there is relatively little risk that minor electrical or optical defects in its construction or operation will cause burst errors of troublesome length or frequency to appear in the data retrieved therefrom. Nevertheless, error correction may be desired under some circumstances. Thus, it will be understood that the data may be encoded (by means not shown) in accordance with an error correction code, such as a conventional Hamming code, prior to being stored in the memory 10. Moreover, if error correction is employed, it may be desireable to modify the configuration of the photodetector array 14, so that it has dedicated storage elements (not shown) for storing the parity bits used for error correction purposes. For example, if the data is organized to be selectively addressed in 256 bit long data segments (each of which contains four 64 bit data words) and if seven parity bits are required for each data word, the photodetector array 14 advantageously has at least 284 detector/storage elements along each of its electrically addressable rows or columns. Of course, the number of photodetectors along the other or non-electrically addressable axis of the array 14 might be reduced somewhat to leave sufficient space for integrating additional support electronics (also not shown) with the array 14 through the use of conventional very large scale integrated (VLSI) circuit technology.

As shown, the lenslets 12aa–12nn are generally centered on the photosensors 14aa–14nn, respectively. However, each of the photoemitters 11aa–11jj occupies a unique lateral position with respect to each of the apertures 12aa–12nn. Thus, in the absence of suitable optical correction, the images focused onto the data mask 13 would tend to have their centers shifted by different amounts with respect to the centers of the photosensors 14aa–14nn, respectively, and would tend to have non-uniform magnifications widthwise and depthwise of the data mask 13. This lateral distortion is undesireable because it causes mis-centering of the memory sectors 16aa–16nn with respect to the photosensors 14aa–14nn, respectively, and irregular spacing of the memory cells 17aa–17jj within each of the memory sectors 16aa–16nn.

Although the positioning of the bits stored on the data mask 13 could be appropriately adjusted while the data is being mapped into the memory 10 to account for such lateral distortion, the preferred solution is to optically correct for it. To that end, the photoemitter array 11 is located in the front focal plane of a collimating lens 18 which substantially collimates the light emitted by each of the photoemitters 11aa–11jj before it reaches the lens array 12. Thus, whenever one of the photoemitters 11aa–11jj is energized, the light emitted thereby passes through the apertures of all of the lenslets 12aa–12nn at substantially the same, unique angle. Consequently, the images focused onto the data mask 13 are essentially centered on the photosensors 14aa–14nn, respectively, and have substantially constant magnifications widthwise and depthwise thereof. To provide the appropriate correction for the lateral distortion at all positions across the full width and depth of the memory 10, the collimating lens 18 typically is a multi-element lens or an aspheric.

Figure 4:
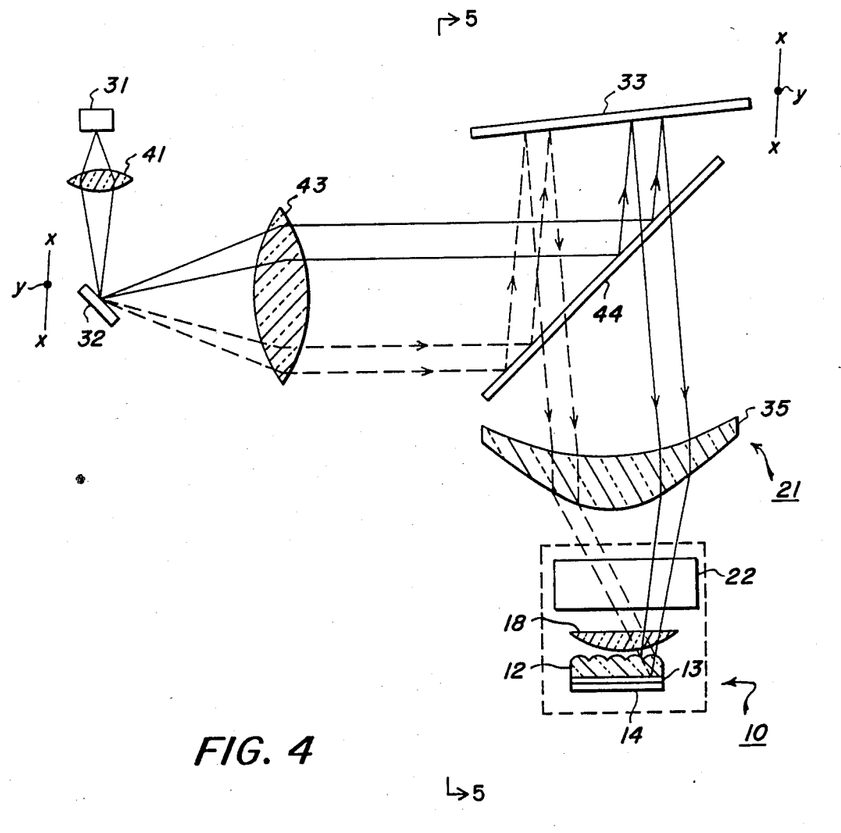
FIG. 4 is a simplified elevational view of a data writer for programming solid state optical memories in accordance with the present invention.
Figure 5:
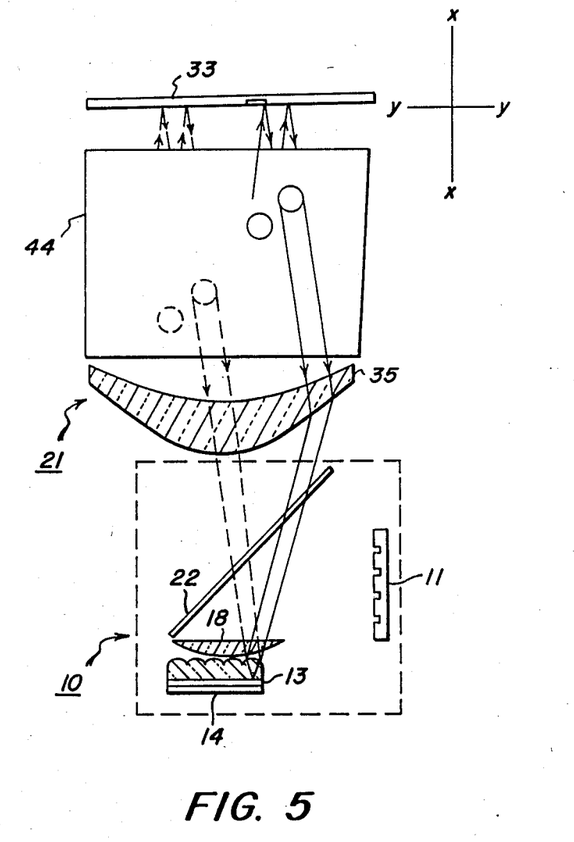
FIG. 5 is a sectional view taken along the line 5—5 in FIG. 4 to further illustrate the data writer.

In accordance with the present invention, the data mask 13 is an erasable optical recording medium, such as a tellurium suboxide, $TeO_x$. For example, the data mask 13 may be a 0.1 micron or so thick $TeO_{1.2}$ film. Furthermore, as shown in FIGS. 4 and 5, there is a data writer 21 for programming, erasing and re-programming the data mask 13 in situ while self-aligning the lenslets 12aa–12nn with the data recorded thereon. A beam splitter 22 has been added to the memory 10 for folding the optical path for the light emitted by the photoemitters 11aa–11jj. It gives the data writer 21 and the photoemitters 11aa–11jj unobstructed transmissive and reflective access, respectively, to the optics of the memory 10, but it does not alter the operation of the memory 10 in any way. During the data programming and erasing processes, the memory 10 is precisely positioned with respect to the data writer 21, such as by a suitable alignment fixture (not shown). However, data may be readout from the memory 10 regardless of its attitude because the positions and alignment of the photoemitter array 11, the lens array 12, the data mask 13, the photodetector array 14, the collimating lens 18, and the beam splitter 22 are essentially fixed with respect to one another.

As illustrated in FIGS. 4 and 5, the data writer 21 comprises a suitable light source 31 for supplying a light beam (hereinafter referred to as the "write/erase beam"); a first dual axis deflector 32 for serially deflecting the write/erase beam to field positions corresponding to the photoemitters 11aa–11jj, respectively; a second dual axis deflector 33 for serially deflecting the write/erase beam from each of those field positions to the lenslets 12aa–12nn, respectively; and a focusing lens 35 for focusing the write/erase beam into the apertures of the lenslets 12aa–12nn as it is being scanned thereacross. As will be seen, the write/erase beam is pulsed, and it records data on or erases data from the recording medium depending on the fall time of those pulses. As is known, the quenching time controls the reversible molecular transformations or phase changes which tellurium suboxides, such as $TeO_{1.2}$, undergo when exposed to optical radiation at a suitably high power level of 10 mw. or so. If such a suboxide is rapidly quenched (i.e., if the fall time of the pulse of light applied thereto is less than about 100 nanoseconds), the radiated region will have an amorphous structure. If, on the other hand, the suboxide is slowly quenched (i.e., if the fall time of the optical pulse is longer than about 1000 nanoseconds) the radiated region will have a crystalline structure. The optical transmissivity of such a recording media is much higher in its crystalline regions than in its amorphous regions, so there is sufficient contrast for storing binary data.

To program or re-program the data mask 13, the intensity of the write beam is modulated in accordance with the values ("1 or "0") of successive bits of a data bit stream, so that the bits are serially optically recorded on the data mask 13 from the field angles of the photoemitters 11aa–11jj as imaged onto the data mask 13 by the lenslets 12aa–12nn, respectively. Accordingly, the lenslets 12aa–12nn align themselves with the recorded data. Each bit is recorded at a unique position on the data mask 13 as determined by the photoemitter field angle at which and the lenslet through which it is recorded. The light source 31 suitably is a diode laser having an output power level selected to deliver approximately 10 milliwatts to the surface of the data mask 13. The data stream, in turn, is applied to the laser 31, thereby causing it to switch "on" and "off" in response to high ("1") and low ("0") logic level bits, respectively. If the recording medium 13 is initialized to have a more or less uniform crystalline structure before any data is recorded thereon, the laser 31 is controlled so that it is momentarily pulsed on and rapidly switched of in response to the high low ("1") logic level bits, whereby those bits are represented by localized amorphous areas of the recording medium 13 Alternatively, the laser 31 could be pulsed on and rapidly swithched off in response to the low ("0") logic level bits. In the final analysis, the optical transmission profile of the disk 13 ultimately is determined by the lateral distribution of the amorphous and crystalline regions which are provided to differentiate between high ("1") and low ("0") logic level bits.

More particularly, as shown, there is a beam shaping and focusing lens 41 for bringing the write/erase beam emitted by the laser 31 to focus on an x-y galvo mirror 32 which, in turn, reflects it into a collimating lens 43. The lens 43 collimates the write/erase beam and applies it to a beam splitter 44 where it is reflected onto another x-y galvo mirror 33. The beam splitter 44 is provided to reduce the cross sectional distortion which is introduced into beam falling on the galvo mirror 33 as a result of the rotation of the galvo mirror 32, so it may be eliminated if such distortion is acceptable. In the illustrated embodiment, however, the write/erase beam reflects from the galvo mirror 33, and then passes through the beam splitter 44 to a focusing lens 35, which brings it to focus substantially in the plane of the apertures of the lenslets 12aa–12nn (FIG. 2). Since the write/erase beam passes through the beam splitter 22 and the collimating lens 18 while being brought to focus, the focusing lens 35 is designed to account for those components.

To scan the write/erase beam across the data mask 13, the first x-y galvo mirror 32 is rotated about its axes (by means not shown) as a function of time, so that the write beam falls on the second x-y galvo mirror 33 at successive field positions which correspond to the field positions of the photoemitters 11aa–11jj, respectively. The galvo mirror 33 is also rotated about its axes (by means not shown) as a function of time, whereby the write beam is scanned across the lenslets 12aa–12nn from the field position of each of the photoemitters 11aa–11jj. The lens 35 beings the write/erase beam to an essentially diffraction limited focus substantially in the plane of the apertures of the lenslets 12aa–12nn, with a waist diameter or "focused spot size" which is approximately equal to the diameter of those apertutes. Hence, the lenslets 12aa–12nn sequentially receive and refocus the write/erase beam to a smaller spot size on the data mask 13, and the diffractive dispersion off their apertures is more or less minimized. Suitable allowances are made, of course, for any difference in the optical distances at which the photoemitter array 11 and the galvo mirror 33 are displaced from the collimating lens 18, so that field angles subtended by the write beam from its field positions on the galvo mirror 33 are essentially equal to the field angles subtended by the photoemitters 11aa–11jj, respectively.

To record data on or to erase data from the data mask 13, the write/erase beam is scanned across the lenslets 12aa–12nn at the field angles of the photoemitters 11aa–11jj while its intensity is being modulated synchronously modulated in accordance with successive bits of the data stream or in accordance with periodic erase pulses. The data writing and erasing processes are essentially identical, except that writing and erasing are performed using optical pulses having different fall times (e.g., a fast fall time for writing and a slow fall time for erasing, or vice versa). As will be appreciated, the initialized state (i.e., amorphous or crystalline) of the blank recording medium 13 determines the appropriate fall time assignments for the write and erase pulses.

The scanning pattern for the write/erase beam may be selected to satisfy almost any desired data mapping pattern. If, for example, the bits of successive multi-bit data blocks are serially applied to the laser 31 to intensity modulate the write beam, the bits typically are mapped onto the data mask 13 by initializing the data writer 21 so that the first bit is recorded via the lenslet 12aa at the field angle of the photoemitter 11aa. Thereafter, to record the first data block on the data mask 13, the galvo mirror 33 is cyclically rotated at a predetermined fast scan rate about its x-axis and at a predetermined slow scan rate about its y-axis, so that the write beam is scanned across the lenslets 12aa–12nn row-by-row to map bits onto the data mask 13 at the field angle of the photoemitter 11aa. Subsequent data blocks are recorded by repeating the above process while cyclically rotating the galvo mirror 32 about its x and y-axes, at even slower predetermined scan rates, whereby the write beam is repeatedly scanned across the lenslets 12aa-12nn to map the bits of these subsequent data blocks onto the data mask 13 at the field angles of the photoemitters 11ba-11jj, respectively. In other words, the bits of the successive data blocks are sequentially mapped into the memory sectors 16aa-16nn so that they spatially coincide with the memory cells 17aa-17jj, respectively. Any distortion which the lenslets 12aa-12nn may cause is essentially equalized (i.e., the lenslets 12aa-12nn are self aligned with the data recorded on the data mask 13) being that they are illuminated from substantially the same angles during the data recording and data addressing processes. The same scanning pattern is used to erase data from the recording medium 13. Partial erasures and partial re-programming of the recording medium 13 are carried out by timing the erase and data pulses to coincide with the scan of the particular memory cells 17aa-17jj that it is desired to erase and re-program, respectively.

CONCLUSION

In view of the foregoing, it will now be understood that the present invention provides a eraseable solid state optical memory. Moreover, it will be seen that provision has been made for self-aligning the imaging means of such a memory with the data stored on its data mask. While it will be evident that the invention may advantageously applied to block oriented solid state optical memories having distibuted data storage architectures, it will be understood that the broader aspects of the invention are not limited thereto.

What is claimed is:

1. In a solid state optical memory having a photoemitter array including a plurality of selectively and individually energizeable photoemitters, and a photodetector array including a plurality of photosensors; the improvement comprising an eraseable optical recording medium optically interposed between said photoemitter array and said photodetector array, said recording medium being optically programmable and eraseable in situ for eraseably storing optically addressable data in position to be read out selectively by said photosensors in response to the selective energization of said photoemitters, and imaging means optically aligned between said photoemitter array and said recording medium for imaging all of the photoemitters of said photoemitter array in parallel onto said recording medium at a plurality of spaced apart locations, whereby said memory is optically partitioned into a plurality of memory sectors, and each of said sectors is optically subdivided to provide a plurality of selectively illuminable memory cells.

2. The improvement of claim 1 wherein said memory further includes beam splitting means to define alternative optical paths for illuminating said imaging means, and said photoemitter array is located on one of said optical paths.

3. The improvement of claim 2 wherein said imaging means is a lens array having a first surface configured to define a plurality of laterally separated lenslets and a last surface bonded to said recording medium, whereby said recording medium is spatially fixed with respect to said lenslets.

4. The improvement of claim 3 wherein said recording medium is a chalcogenide material, whereby data may be optically recorded on and erased from said recording medium by exposing it to a pulsed light beam having a fall time selected to cause localized transformations in said material between an amorphous state and a crystalline state.

5. The improvement of claim 4 wherein said recording medium is a tellurium suboxide.

6. A device for eraseably programming a solid state optical memory having a photoemitter array including a plurality of selectively and individually energizeable photoemitters, a photodetector array including a plurality of photosensors, and an eraseable optical recording medium located between said photoemitter array and said photodetector array: said device comprising means for scanning a light beam across said imaging means in situ in accordance with a predetermined scanning pattern, said light beam being intensity modulated during a programming mode of operation to record optically addressable data on said recording medium and being controlled during a data erasing mode of operation to optically erase data previously recorded on said recording medium, said scanning pattern being selected to permit said data to be read out selectively in response to the selective energization of said photoemitters and to allow said data to be erased when desired.

* * * * *